United States Patent
Lee et al.

(10) Patent No.: US 7,919,416 B2
(45) Date of Patent: Apr. 5, 2011

(54) METHOD OF FORMING CONFORMAL DIELECTRIC FILM HAVING SI-N BONDS BY PECVD

(75) Inventors: Woo-Jin Lee, Tama (JP); Akira Shimizu, Sagamihara (JP); Atsuki Fukazawa, Tama (JP)

(73) Assignee: ASM Japan K.K., Tokyo (JP)

( * ) Notice: Subject to any disclaimer, the term of this patent is extended or adjusted under 35 U.S.C. 154(b) by 0 days.

(21) Appl. No.: 12/357,174

(22) Filed: Jan. 21, 2009

(65) Prior Publication Data

US 2010/0184302 A1 Jul. 22, 2010

(51) Int. Cl.
*H01L 21/337* (2006.01)

(52) U.S. Cl. ........ 438/792; 438/723; 438/712; 438/710; 438/711; 438/763; 257/324; 257/632; 257/E21.266; 257/E29.165; 257/E21.487

(58) Field of Classification Search .................. 438/149, 438/791, 792, 99, 723, 712, 711, 710, 763; 257/632, 324, E21.266, E21.487, E29.165
See application file for complete search history.

(56) References Cited

U.S. PATENT DOCUMENTS

| | | | |
|---|---|---|---|
| 5,801,104 A | 9/1998 | Schuegraf et al. | |
| 6,017,779 A * | 1/2000 | Miyasaka | 438/149 |
| 6,974,781 B2 | 12/2005 | Timmermans et al. | |
| 7,092,287 B2 | 8/2006 | Beulens et al. | |
| 7,294,582 B2 | 11/2007 | Haverkort et al. | |
| 7,297,641 B2 | 11/2007 | Todd | |
| 2005/0181535 A1* | 8/2005 | Yun et al. | 438/99 |
| 2006/0019502 A1* | 1/2006 | Park et al. | 438/791 |
| 2006/0199357 A1 | 9/2006 | Wan | |
| 2007/0251444 A1 | 11/2007 | Gros-Jean et al. | |
| 2008/0003838 A1 | 1/2008 | Haukka | |
| 2008/0242116 A1* | 10/2008 | Clark | 438/791 |
| 2008/0317972 A1 | 12/2008 | Hendriks | |

* cited by examiner

*Primary Examiner* — William M Brewster
*Assistant Examiner* — Wilner Jean Baptiste
(74) *Attorney, Agent, or Firm* — Knobbe Martens Olson & Bear LLP (57) ABSTRACT

A method of forming a conformal dielectric film having Si—N bonds on a semiconductor substrate by plasma enhanced chemical vapor deposition (PECVD) includes: introducing a nitrogen- and hydrogen-containing reactive gas and an additive gas into a reaction space inside which a semiconductor substrate is placed; applying RF power to the reaction space; and introducing a hydrogen-containing silicon precursor in pulses into the reaction space wherein a plasma is excited, thereby forming a conformal dielectric film having Si—N bonds on the substrate.

20 Claims, 5 Drawing Sheets

METHOD OF FORMING CONFORMAL DIELECTRIC FILM HAVING SI-N BONDS BY PECVD

BACKGROUND

1. Field of the Invention

The present invention relates to semiconductor integrated circuit manufacturing and, more particularly to a method of forming a conformal dielectric film such as a silicon nitride film.

2. Description of the Related Art

In integrated circuits fabricated on semiconductor substrates for large scale integration require multiple levels of metal interconnections to electrically interconnect discrete layers of semiconductor devices formed on semiconductor chips. The different levels of interconnections are separated by various insulating or dielectric layers, which are etched to form via holes so as to connect one level of metal to another.

The evolution of chip design continually requires faster circuitry and greater circuit density than before. For faster circuits with greater circuit densities, certain properties are required of materials used to fabricate such integrated circuits, particularly as the dimensions of integrated circuit components are reduced to the sub-micron scale. Also, for greater integrated circuit densities, certain process sequences are required for the manufacture of integrated circuit components.

In recent years, silicon nitride layers deposited at low temperatures (less than 400° C.) have been used in a number of important applications for memory devices, for example, as a passivation layer, a surface protection layer and/or a spacer for a transistor gate. Silicon nitride films may be formed by a plasma enhanced chemical vapor deposition (PECVD) method. The main advantages of the PECVD method over other CVD methods are higher deposition rates, and the controllability of over a wide range of refractive indices. A further advantage of the PECVD method is that the process can take place at a relatively low temperature, for example temperatures under 400° C., keeping the total thermal budget of the cell processing to a minimum.

However, the PECVD method for forming silicon nitride leads to poor conformality or poor step coverage on a substrate containing small and/or high aspect ratio features. In small circuits and devices, such as ultra-large scale integrated (ULSI) circuitry, poor conformal coverage can hamper the development of higher density circuit devices and elements.

SUMMARY

An object of at least one embodiment of the present invention is to provide a method of forming a hydrogen-containing conformal layer having Si—N bonds, such as a silicon nitride layer, on surfaces of trenches for an integrated circuit at low temperatures, for example temperatures below 400° C.

In one embodiment of the invention a method of forming a conformal dielectric film having Si—N bonds on a semiconductor substrate by plasma enhanced chemical gas deposition (PECVD) is provided. The method includes introducing a nitrogen- and hydrogen-containing reactive gas and an additive gas into a reaction space inside which the semiconductor substrate is placed, RF power is applied to the reaction space. A hydrogen-containing silicon precursor is introduced in pulses of less than 5-second duration into the reaction space wherein a plasma is excited, thereby forming a conformal dielectric film having Si—N bonds on the substrate. In this disclosure, the "gas" includes vaporized solid and/or liquid.

In another embodiment, a method of forming a hydrogen-containing highly conformal layer having Si—N bonds on a semiconductor substrate by plasma enhanced chemical vapor deposition (PECVD), comprises; introducing a reactive gas and an additive gas into a CVD reaction chamber inside which a semiconductor substrate is placed wherein the semiconductor substrate temperature is maintained in the range of approximately 0° C. to approximately 400° C. After the reactive and additive gases are introduced into the reaction chamber, a plasma exciting condition is provided in the reaction chamber. A hydrogen-containing silicon precursor is introduced into the reaction chamber in pulses using a pulse flow control valve, wherein the silicon precursor is introduced into the reaction chamber where the plasma is excited, thereby forming a hydrogen-containing conformal film having Si—N bonds on the substrate by plasma reaction of the gases.

In an embodiment, the substrate is maintained at a temperature of about 0° C. to 400° C. A hydrogen-containing silicon precursor may be composed of: a combination of silicon and hydrogen; a combination of silicon, hydrogen, and nitrogen; or a combination of silicon, hydrogen, carbon, and nitrogen. In an embodiment, the vaporized hydrogen-containing silicon precursor may be introduced in pulses of a duration of approximately 0.1 sec to approximately 1.0 sec at with an interval between pulses of approximately 0.5 sec to approximately 3 sec while maintaining plasma polymerization. In an embodiment, the reaction gas may be a combination of nitrogen gas and hydrogen gas or a combination of ammonia gas and hydrogen gas. In an embodiment, the additive gas may be selected from the group consisting of He, Ar, Kr, Xe, and the molar flow rate of the additive gas may be greater than the molar flow rate of the hydrogen-containing silicon source. In an embodiment, the reaction chamber may be maintained at a pressure of about 0.1 Torr to about 10 Torr. In an embodiment, RF power may be between approximately 0.02 W/cm$^2$ and approximately 20 W/cm$^2$. After being introduced into the chamber, the reactive gas reacts with the hydrogen-containing silicon precursor supplied in pulses by plasma reaction so as to form a conformal film having Si—N bonds on a substrate surface.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are oversimplified for illustrative purpose and are not necessarily to scale.

DETAILED DESCRIPTION

The present invention is described with reference to embodiments which are not intended to limit the present invention. Additionally, an element applied in an embodiment may freely be applicable to other embodiments, and elements applied in different embodiments may mutually be replaceable or interchangeable unless special conditions are attached thereto. Further, the ranges indicated below may include or exclude the endpoints in embodiments.

An embodiment provides a method of forming a conformal dielectric film having Si—N bonds on a semiconductor substrate by plasma enhanced chemical vapor deposition (PECVD), which comprises: (a) introducing a nitrogen- and hydrogen-containing reactive gas and an additive gas into a reaction space inside which a semiconductor substrate is placed; (b) applying RF power to the reaction space; and (c) introducing a hydrogen-containing silicon precursor in pulses of less than a 5-second duration into the reaction space wherein a plasma is excited, thereby forming a conformal dielectric film having Si—N bonds on the substrate.

In an embodiment, the hydrogen-containing silicon precursor may have a formula of $Si_\alpha H_\beta X_\gamma$, wherein $\alpha$, $\beta$ and $\gamma$ are integers and $\gamma$ includes zero. X can comprise N, F, and/or $C_m H_n$, wherein m and n are integers. In an embodiment, $\alpha$ may be 1 to 5, $\beta$ may be 1 to 10, and $\gamma$ may be 0 to 6. In an embodiment, m may be 2 to 18, and n may be 6 to 30.

In any of the foregoing embodiments, the substrate may be kept at a temperature of 0° C. to 400° C. while the film is deposited thereon. In some embodiments the substrate temperature is about 250° C. to about 350° C. during deposition.

In any of the foregoing embodiments, the hydrogen-containing silicon precursor may be vaporized upstream of the reaction space.

In any of the foregoing embodiments, the hydrogen-containing precursor may be liquid at room temperature.

In any of the foregoing embodiments, the hydrogen-containing silicon precursor may be introduced in pulses while the reactive gas and the additive gas are continuously introduced and the RF power is continuously applied.

In any of the foregoing embodiments, the hydrogen-containing silicon precursor may be introduced in pulses of a duration of approximately 0.1 sec to 1.0 sec. In some embodiments the pulses of the hydrogen-containing silicon precursor are of a duration of about 0.2 sec to about 0.3 sec.

In some embodiments, the pulses of the hydrogen-containing silicon precursor are separated by intervals of approximately 0.1 sec to 3.0 sec. In some embodiments the intervals are about 0.5 sec to about 3.0 sec or 1.0 sec to about 2.0 sec. In an embodiment, the pulse duration may be equal to or shorter than the interval.

In any of the foregoing embodiments, the reactive gas may comprise a mixture of $N_2$ and $H_2$, a mixture of $NH_3$ and $H_2$, and a nitrogen-boron-hydrogen gas. In an embodiment, the reactive gas may comprise a mixture of $N_2$ and $H_2$ with a molar flow rate ratio of $N_2/H_2$ of approximately 1/1 to 10/1. In some embodiments the molar flow rate ratio of $N_2$ and $H_2$ is about 2/1 to about 4/1. In an embodiment, the reactive gas may comprise a mixture of $NH_3$ and $H_2$ with a molar flow rate ratio of $NH_3/H_2$ of approximately 1:1 to 1:10. In some embodiments the molar flow rate ratio of $NH_3/H_2$ is approximately 1:1 to 1:3.

In any of the foregoing embodiments, the additive gas may be one or more gass selected from the group consisting of He, Ar, Kr, and Xe, and the molar flow rate of the additive gas may be greater than the molar flow rate of the hydrogen-containing silicon source. In an embodiment, a flow rate of the additive gas introduced into the reaction chamber may be approximately 30 sccm to 3000 sccm. In some embodiments the flow rate of the additive gas is about 1500 sccm to about 2500 sccm. In an embodiment, the additive gas may comprise a mixture of helium and argon or a mixture of helium and krypton. In an embodiment, the additive gas may comprise a mixture of helium and argon with a molar flow rate ratio of helium/argon of approximately 3/1 to 20/1. In some embodiments the molar flow rate ratio of helium/argon is about 5/1 to about 15/1 In an embodiment, the additive gas comprises a mixture of helium and krypton with a molar flow rate ratio of helium/krypton of approximately 3/1 to 20/1. In some embodiments the molar flow rate ratio of helium/krypton is about 5/1 to about 15/1.

In some embodiments, only the three types of gas (i.e., the hydrogen-containing silicon precursor, reactive gas, and additive gas) may be used, and no other gases such as a carbon precursor may be used.

In any of the foregoing embodiments, the conformal dielectric film may be a silicon nitride film.

In any of the foregoing embodiments, the RF power may be applied in the range of approximately 0.02 W/cm² to approximately 20 W/cm² per area of the substrate (e.g., a range of 0.05-10 W/cm², a range of 1-5 W/cm², and a range of 0.5-3 W/cm²) and the reaction space pressure may be adjusted in the range of approximately 0.1 Torr to approximately 10 Torr. In some embodiments the pressure in the reaction space may be approximately 2 Torr to 9 Torr.

In any of the foregoing embodiments, pulse durations and intervals of the pulses of introducing the hydrogen-containing silicon precursor may be such that the conformal dielectric film has a step coverage or conformality of at least 80% (e.g., 80% to 95%). In an embodiment, the pulse durations and intervals of the pulses of introducing the hydrogen-containing silicon precursor may be such that the conformal dielectric film has an etching rate lower than a thermal oxide film, for example when using buffered HF to perform a wet etch. In an embodiment, the pulse durations and intervals between pulses of introducing the hydrogen-containing silicon precursor may be such that the conformal dielectric film has a leakage current lower than 1.0 E-08 A/cm² at 1 MV. In some embodiments the leakage current is between about 1.0 E-08 A/cm² and about 1.0 E-10 A/cm² at 1 MV.

In any of the foregoing embodiments, the dielectric constant of the conformal dielectric film may be in the range of 4.5 to 7.5. In some embodiments the dielectric constant is about 6.5 to about 7.2.

In any of the foregoing embodiments, the hydrogen-containing silicon precursor may be vapor or liquid at room temperature. In some embodiments the hydrogen-containing silicon precursor may be selected from the group consisting of silane, disilane, trisilyamine, and bis(tert-butylamino)silane.

In some embodiments, a plasma reaction step can be performed using a frequency exceeding 5 MHz. For example, a high RF frequency power of 13.56 MHz, 27 MHz, or 60 MHz can be used. In some embodiments a high RF frequency power can be combined with a low RF power of 5 MHz or less. In some embodiments the ratio of low-frequency power to high-frequency power may be 0 to about 50% or less. In some embodiments the ratio of low-frequency power to high-frequency power is 0 to about 30% or less.

Figure 1:
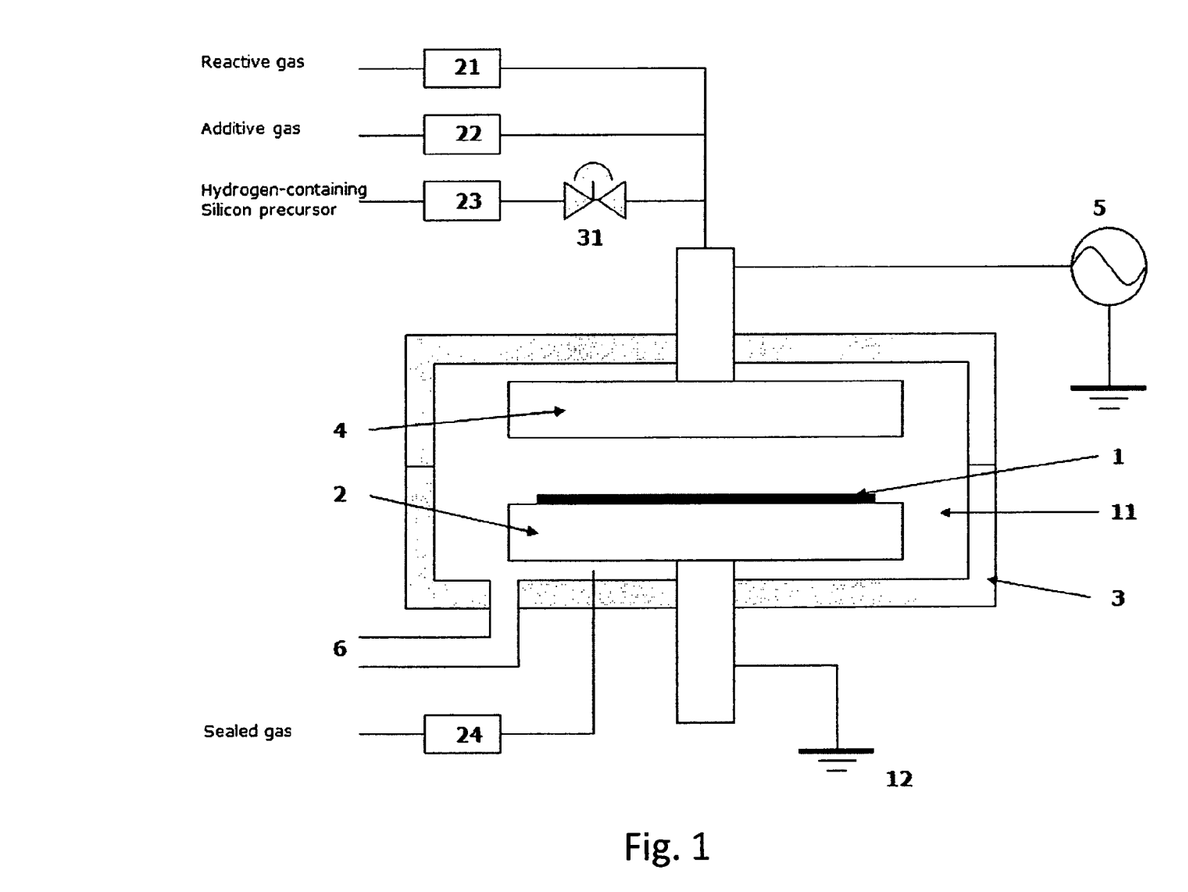
FIG. 1 is a schematic representation of a PECVD apparatus for depositing a silicon nitride film according to one embodiment of the present invention.

Embodiments are explained with reference to the drawings which are not intended to limit the present invention. FIG. 1 is a schematic view of an apparatus combining a plasma CVD reactor and flow control valves, desirably in conjunction with controls programmed to conduct the sequences described below, which can be used in an embodiment of the present invention.

In this example, by providing a pair of electrically conductive flat-plate electrodes 4, 2 in parallel and facing each other in the interior 11 of a reaction chamber 3, applying RF power 5 to one side, and electrically grounding 12 the other side, a plasma is excited between the electrodes. A temperature regulator is provided in a lower stage (which also serves as the lower electrode 2), and a temperature of a substrate 1 placed thereon is kept constant at a given temperature. The upper electrode 4 serves as a shower plate as well, and reaction gas and additive gas are introduced into the reaction chamber 3 through gas flow controllers 21, 22, respectively, and the shower plate. Also the hydrogen-containing silicon precursor is introduced into the reaction chamber 3 through a gas flow controller 23, a pulse flow control valve 31, and the shower plate. Additionally, in the reaction chamber 3, an exhaust pipe 6 is provided through which gas in the interior 11 of the reaction chamber 3 is exhausted. Additionally, the reaction chamber is provided with a seal gas flow controller 24 to introduce seal gas into the interior 11 of the reaction chamber 3. A separation plate for separating a reaction zone and a transfer zone in the interior of the reaction chamber is omitted from this schematic figure. The seal gas is not required but is used in some embodiments for aiding in preventing reaction gas from communicating with the lower part of the chamber below the separation plate.

For the pulse flow control valve 31, a pulse supply valve that is used for ALD (atomic layer deposition) can be used in an embodiment.

Figure 2A:
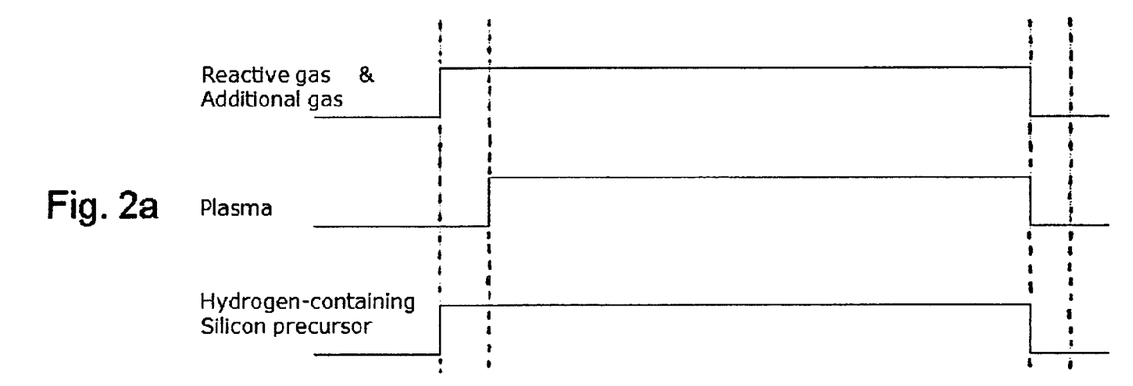
FIGS. 2a and 2b show process steps of a comparative PECVD method and those of an embodiment of the present invention for depositing a silicon nitride film, respectively.
Figure 2B:
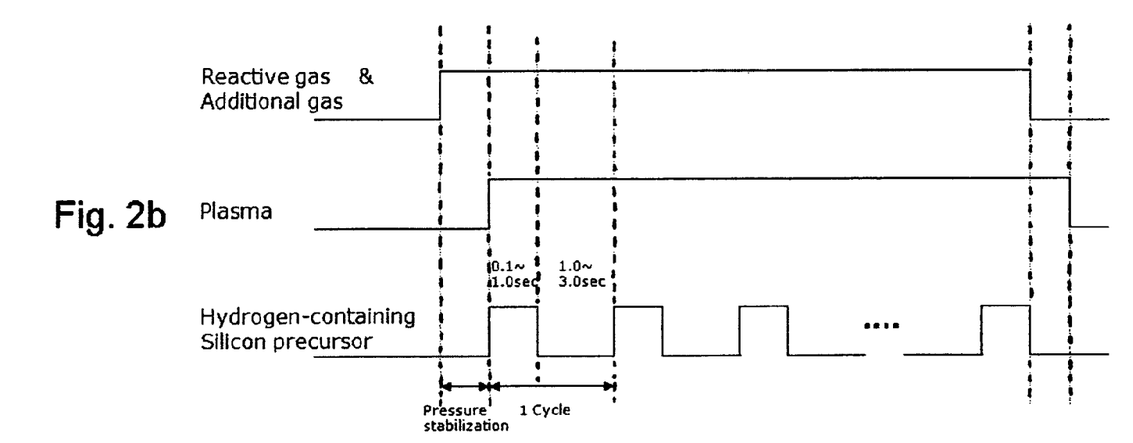

FIG. 2a shows process steps of a comparative PECVD method and FIG. 2b shows process steps of an embodiment of the present invention method for depositing a silicon nitride films. The comparative method is carried out as shown in FIG. 2a wherein a main (silicon) precursor, reactive gas and additive gas, is introduced into a reaction chamber inside which a substrate is placed, and a plasma is excited while maintaining the supply of all three types of gas. Consequently, a silicon nitride film can be formed on the substrate by a plasma reaction. Formed silicon nitride films by the comparative PECVD method have poor step coverage that may be caused by the overabundant vapor phase reaction which prevents surface migration of depositing material.

In contrast, in an embodiment of the present invention, a silicon precursor is introduced into the reaction chamber in pulses of less than a 5-second duration, preferably less than a 2-second duration, so as to effectively inhibit excessive vapor phase reaction, thereby improving step coverage or conformality. For example, the embodiment of the present invention shown in FIG. 2b introduces a silicon precursor into the reaction chamber through a pulse flow control valve for approximately 0.1 sec to approximately 1.0 sec and then shuts off the pulse flow control valve for approximately 1.0 sec to approximately 3 sec. The introduction of the silicon precursor in pulses is repeated. By doing this, a large amount of hydrogen and nitrogen can be added to the process which is believed to significantly enhance the H*, N* radicals during film growth, resulting in improving surface migration of the deposition material so as to form a highly conformal silicon nitride film on a substrate.

In an embodiment, the average thickness deposited per cycle may be about 0.6 nm/cycle to about 1.0 nm/cycle. The pulse supply of the silicon precursor can be continued until a desired thickness of film is obtained. If the desired thickness of film is 20 nm to 100 nm, about 20 cycles to about 150 cycles (e.g., 40 to 100 cycles) may be conducted.

In some embodiments using a particular single wafer PECVD reactor, if the supply pulse is less than 0.1 sec, the deposition rate may become slow and uniformity of the deposited film may become bad because the amount of supplied precursor is not enough to deposit and grow a uniform film. On the other hand, if the supply pulse is more than 1.0 sec, step coverage may become bad (less than 80%) because of overabundant vapor phase reactions. In an embodiment, for a high step coverage structure, overabundant gas phase reaction should be avoided and surface migration should occur during deposition. The pulse supply sequence of FIG. 2B provides variables that can be tuned to realize the above. In some embodiments, if the interval between pulses is less than 0.1 sec with a supply duration of 0.1-1.0 sec, it also may cause poor step coverage. On the other hand, if the interval between pulses is more than 3.0 sec with a supply duration of 0.1-1.0 sec, the film profile and step coverage may not substantially be affected, but the whole process time becomes too long.

According to embodiments of the present invention, the conformality of film can surprisingly be improved as compared with other silicon nitride deposition processes.

For forming a conformal silicon nitride layer on a semiconductor substrate, deposition conditions in an embodiment may be as follows:
Silane: 10~200 sccm
Hydrogen: 500~2000 sccm
Nitrogen: 1000~2000 sccm
Process helium: 500~3000 sccm
Sealed helium: 500 sccm
Argon: 50~500 sccm
Substrate temperature: 0~400° C.
RF power: 0.02 W/cm$^2$~20 W/cm$^2$
Pressure: 0.1~10 Torr
Silane supply time: 0.5~1 sec supply, 1~3 sec supply stop In some embodiments a step coverage (conformality) of obtained silicon nitride film may be more than 80%, wherein the step coverage is defined as the ratio percent of the average thickness of silicon nitride layer deposited on the sidewalls of a trench to the average thickness of silicon nitride layer on the upper surface of the substrate. Leakage current may be lower than approximately 1.0 E-08 A/cm$^2$ at 1 MV charge. Additionally, in another embodiment, the reflective index (n) at 633 nm may be in the range of approximately 1.80~2.60.

Another advantage of a conformal silicon nitride deposition process is compatibility with a liquid hydrogen-containing silicon precursor. The deposition conditions in an embodiment may be as follows:
Trisilylamine: 10~2000 sccm
Hydrogen: 500~2000 sccm
Nitrogen: 500~2000 sccm
Process helium: 0~5000 sccm
Sealed helium: 500 sccm
Argon: 50~500 sccm
Substrate temperature: 0~400° C.
RF power: 0.02 W/cm$^2$~20 W/cm$^2$
Pressure: 0.1~10 Torr Trisilylamine supply time: 0.1~0.5 sec supply, 0.1~2 sec supply stop The silicon nitride layer according to embodiments of the present invention may have conformality of more than about 80%, or more than about 90%. Leakage current may be lower than about 1.0 E-08 A/cm$^2$ at a 1 MV charge. Additionally, in another embodiment, the dielectric constant may be about 6.7 to about 7.3. In some embodiments the reflective index (n) at 633 nm may be in the range of about 1.80 to about 2.60. The etching rate of deposited silicon nitride film according to an embodiment of the present invention, as measured using buffered hydrogen fluoride, may be 2 times to 10 times smaller than a conventional thermal silicon oxide film.

The embodiments will be explained with reference to specific examples which are not intended to limit the present invention. The numerical numbers applied in the specific examples may be modified by a range of at least ±50% in other conditions, wherein the endpoints of the ranges may be included or excluded. In the present disclosure where conditions and/or structures are not specified, the skilled artisan in the art can readily provide such conditions and/or structures, in view of the present disclosure, as a matter of routine experimentation.

EXAMPLE 1

An insulative silicon nitride layer was formed on a substrate having trenches under the conditions shown below using the sequence illustrated in FIG. 2b and the PECVD apparatus illustrated in FIG. 1. The trenches included relatively wide trenches (a width of 500 nm and a depth of 350 nm) and relatively narrow trenches (a width of 50 nm and a depth of 350 nm). Thus trenches of different aspect ratio were coated.

Silane: 50 sccm
Hydrogen: 1000 sccm
Nitrogen: 2000 sccm
Process helium: 2000 sccm
Sealed helium: 500 sccm
Argon: 100 sccm
Substrate Temp.: 300° C.
RF power (a frequency of 13.56 MHz): 0.12 W/cm$^2$
Pressure: 6 Torr
Silane supply time: 1 sec supply, 3 sec supply stop After completion of the deposition, the trenches were observed with a scanning electron microscope.

It was confirmed that the step coverage (conformality) was more than 80% (80%-87%), defined as the ratio between the thickness of the sidewall to the thickness of the top coverage. In contrast, the film obtained by the process following the sequence illustrated in FIG. 2a had a step coverage of less than 70%.

EXAMPLE 2

An insulative silicon nitride layer was formed on a substrate having trenches under the conditions shown below using the sequence illustrated in FIG. 2b and the PECVD apparatus illustrated in FIG. 1. The trenches included relatively wide trenches (a width of 500 nm and a depth of 350 nm) and relatively narrow trenches (a width of 50 nm and a depth of 350 nm).

Trisilylamine: 300 sccm
Hydrogen: 500 sccm
Nitrogen: 1000 sccm
Process helium: 1400 sccm
Sealed helium: 500 sccm
Argon: 500 sccm
Substrate temp.: 300° C.
RF power (a frequency of 13.56 MHz): 0.12 W/cm$^2$
Pressure: 6 Torr
Trisilylamine supply time: 0.2 sec supply, 2 sec supply stop After completion of the deposition, the trenches were observed with a scanning electron microscope (SEM).

Figure 3A:
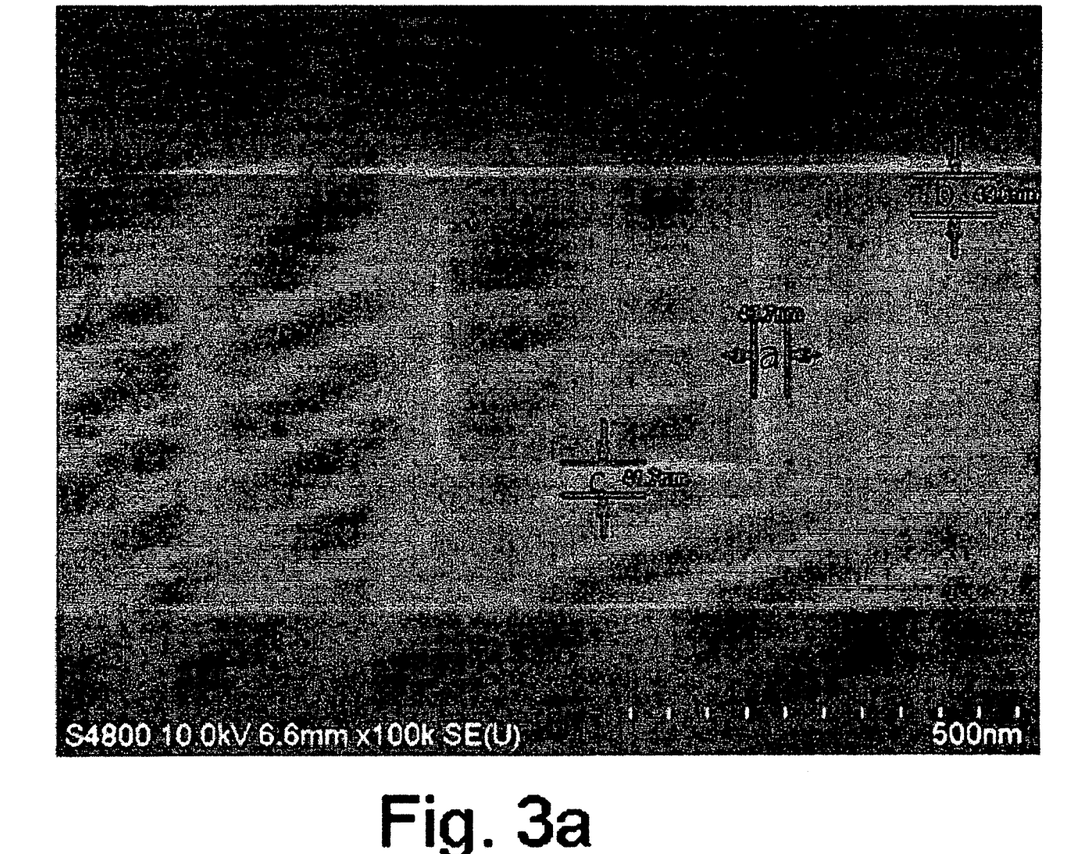
FIGS. 3a and 3b are Scanning Electron Microscope (SEM) photographs of cross-sectional views of conformal silicon nitride films formed according to an embodiment of the present invention.
Figure 3B:
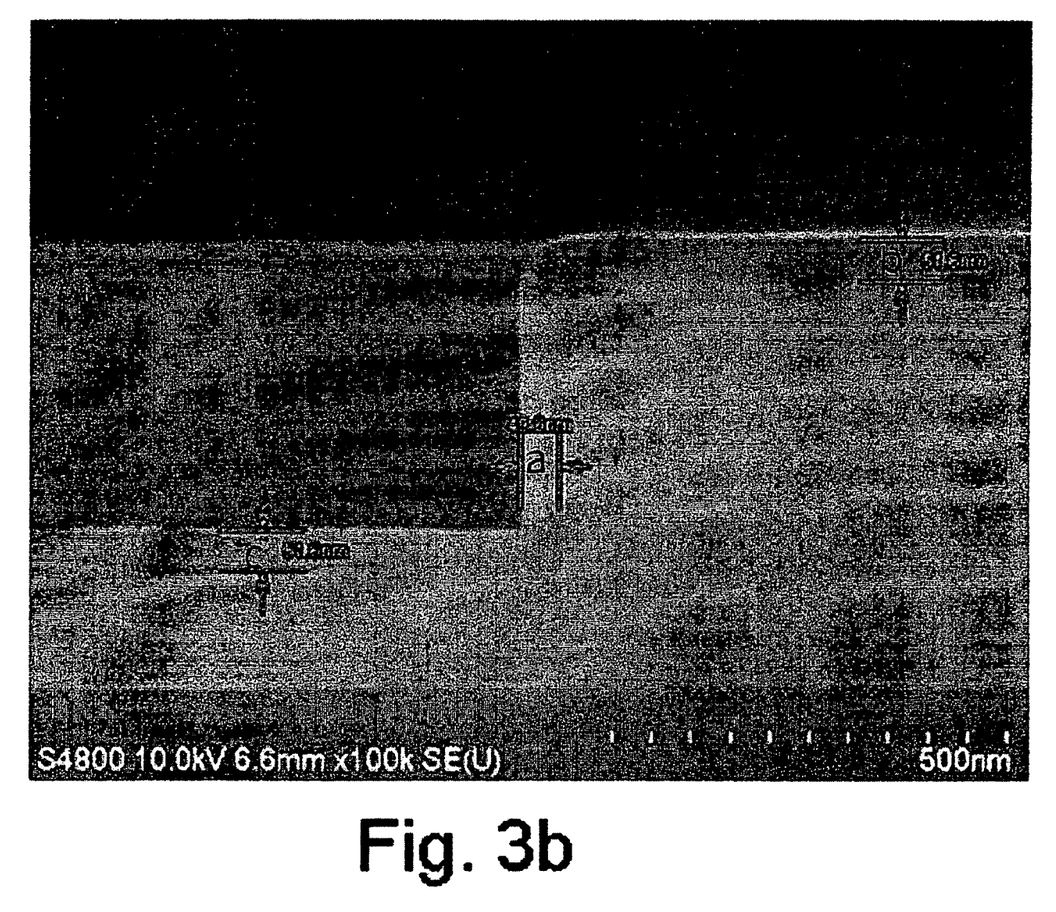
Figure 4:
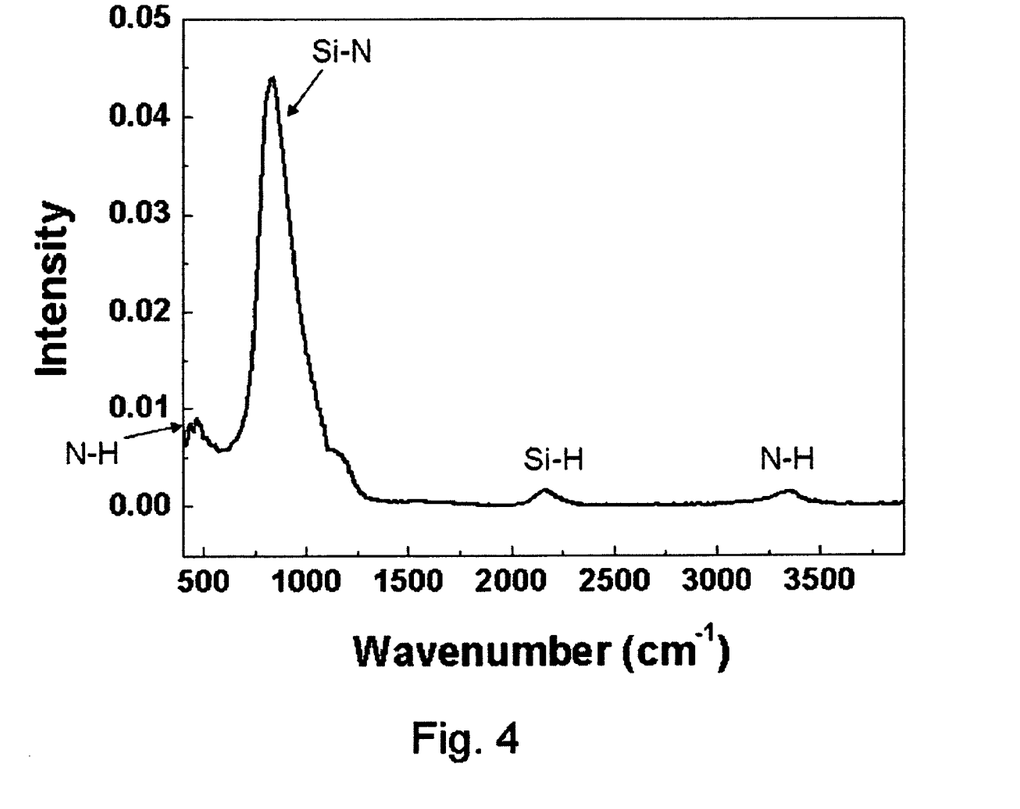
FIG. 4 is a Fourier Transform Infrared (FTIR) spectrum of a conformal silicon nitride film formed according to an embodiment of the present invention.

FIGS. 3a and 3b show the scanning electron microscope cross-sectional view of the substrate with the conformal silicon nitride layer formed. Qualitatively, the silicon nitride layer is highly conformal and completely covers the trench sidewalls. The silicon nitride layer had a conformality of 88% (43.7/49.6) as shown in FIG. 3a (a=43.7 nm, b=49.6 nm, c=41.7 nm) and 96% (49.6/51.6) as shown in FIG. 3b (a=49.6 nm, b=51.6 nm, c=51.6 nm). The measured leakage current was lower than 1.0 E-08 A/cm$^2$ at a 1 MV charge. The dielectric constant was 6.8 at 1 MHz. The refractive index (n) at 633 nm was 1.99. FIG. 4 shows the IR absorption spectra of the deposited silicon nitride film. As shown in FIG. 4, the main Si—N band can be observed and the Si—H and N—H weak bands are also observed. The etching rate of deposited silicon nitride film in this example as measured using buffered hydrogen fluoride was 4 times smaller than a conventional thermal silicon oxide film. The etching test was carried out using a BHF130 etchant. The deposited film (SiN) on the Si substrate was dipped in the BHF130 etchant for 5 min, and then rinsed with de-ionized water. Film thickness was measured by an Ellipsometer.

A significant advantage of the method of at least one of the disclosed embodiments of the present invention is that highly-conformal silicon nitride layers or other Si—N dielectric layers can be formed on various types of substrates. The silicon nitride coatings and other Si—N dielectrics films also may be formed at relatively low substrate temperatures, thereby increasing productivity without thermal damage or consumption of excess thermal budget to the substrate, and thereby expanding the types of applicable substrates. In addition, the method of an embodiment of the present invention can achieve high deposition rates, and can be readily scalable, thereby allowing large-scale application and/or three-dimensional production, such as 3D integration of die-to-wafer or wafer-to-wafer.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A method of forming a conformal dielectric film having Si—N bonds on a semiconductor substrate by plasma enhanced chemical vapor deposition (PECVD), which comprises:

introducing a nitrogen- and hydrogen-containing reactive gas and an additive gas into a reaction space inside which the semiconductor substrate is placed;

applying RF power to the reaction space; and introducing a hydrogen-containing silicon precursor in pulses into the reaction space wherein a plasma is excited, thereby forming a conformal dielectric film having Si—N bonds on the substrate, wherein the hydrogen-containing silicon precursor is introduced in pulses of a duration of approximately 0.1 sec to 1.0 sec with an interval between pulses of approximately 0.1 sec to 3.0 sec, while the reactive gas and the additive gas are continuously introduced, and the RF power is continuously applied.

2. The method according to claim 1, wherein the hydrogen-containing silicon precursor has a formula of $Si_\alpha H_\beta X_\gamma$, wherein $\alpha$, $\beta$ and $\gamma$ are integers ($\gamma$ includes zero), wherein X comprises N, F and/or $C_m H_n$, wherein m and n are integers.

3. The method according to claim 2, wherein the hydrogen-containing silicon precursor consists of Si, H, and N atoms constituting its molecule.

4. The method according to claim 1, wherein the substrate is kept at a temperature of about 0° C. to about 400° C. while the film is deposited thereon.

5. The method according to claim 1, wherein the hydrogen-containing silicon precursor is vaporized upstream of the reaction space.

6. The method according to claim 1, wherein the hydrogen-containing precursor is a liquid at room temperature.

7. The method according to claim 1, wherein the pulse duration is equal to or shorter than the interval between pulses.

8. The method according to claim 1, wherein the reactive gas comprises at least one of a mixture of $N_2$ and $H_2$, a mixture of $NH_3$ and $H_2$, and a nitrogen-boron-hydrogen gas.

9. The method according to claim 8, wherein the reactive gas comprises a mixture of $N_2$ and $H_2$ and has a molar flow rate ratio of $N_2/H_2$ of approximately 1/1 to 10/1.

10. The method according to claim 8, wherein the reactive gas comprises a mixture of $NH_3$ and $H_2$ and has a molar flow rate ratio of $NH_3/H_2$ of approximately 1:1 to 1:10.

11. The method according to claim 1, wherein the additive gas comprises a mixture of helium and argon or a mixture of helium and krypton.

12. The method according to claim 11, wherein the additive gas is a mixture of helium and argon and has a molar flow rate ratio of helium/argon of approximately 3/1 to 20/1.

13. The method according to claim 11, wherein the additive gas is a mixture of helium and krypton and has a molar flow rate ratio of helium/krypton of approximately 3/1 to 20/1.

14. The method according to claim 1, wherein the conformal dielectric film is a silicon nitride film.

15. The method according to claim 1, wherein the RF power is applied in the range of approximately 0.02 W/cm² to approximately 20 W/cm² per area of the substrate and a pressure in the reaction space is adjusted in the range of approximately 0.1 Torr to approximately 10 Torr.

16. The method according to claim 1, wherein pulse durations and intervals of the pulses of introducing the hydrogen-containing silicon precursor are such that the conformal dielectric film has a step coverage or conformality of at least 80%.

17. The method according to claim 16, wherein the pulse durations and intervals of the pulses of introducing the hydrogen-containing silicon precursor are such that the conformal dielectric film has an etching rate lower than thermal oxide film.

18. The method according to claim 16, wherein the pulse durations and intervals of the pulses of introducing the hydrogen-containing silicon precursor are such that the conformal dielectric film has a leakage current lower than 1.0E-08 A/cm² at a 1 MV charge.

19. The method according to claim 1, wherein the RF power is continuously applied.

20. The method according to claim 1, wherein the pulse duration is from approximately 0.1 sec to about 0.3 sec.

* * * * *